(12) United States Patent
Parsa et al.

(10) Patent No.: US 11,592,502 B2
(45) Date of Patent: Feb. 28, 2023

(54) COMPONENT ADJUSTMENT IN A SIGNAL PATH OF AN INTEGRATED SENSOR

(71) Applicant: Texas Instruments Incorporated, Dallas, TX (US)

(72) Inventors: Roozbeh Parsa, Portola Valley, CA (US); Ann Gabrys, Woodside, CA (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 15/647,466

(22) Filed: Jul. 12, 2017

(65) Prior Publication Data

US 2019/0018084 A1    Jan. 17, 2019

(51) Int. Cl.
*G01R 33/26* (2006.01)

(52) U.S. Cl.
CPC ..................... *G01R 33/26* (2013.01)

(58) Field of Classification Search
CPC ........................................................ G01R 33/26
See application file for complete search history.

(56) References Cited

U.S. PATENT DOCUMENTS

| | | | | |
|---|---|---|---|---|
| 3,513,381 A * | 5/1970 | Happer, Jr. | ............. | G01R 33/26 324/304 |
| 3,652,926 A * | 3/1972 | Brun | ..................... | G01R 33/26 324/301 |
| 6,806,991 B1 * | 10/2004 | Sarkar | ................ | G02B 26/0841 359/290 |
| 7,265,370 B2 * | 9/2007 | Blythe | ............... | G01N 21/4738 250/221 |
| 9,869,731 B1 * | 1/2018 | Hovde | ................... | G01R 33/26 |
| 2003/0161378 A1 * | 8/2003 | Zhang | ..................... | H01S 5/141 372/102 |
| 2004/0061939 A1 * | 4/2004 | Bievenour | ............... | G02B 5/24 359/491.01 |
| 2004/0140799 A1 * | 7/2004 | Romalis | ................. | G01R 33/02 324/301 |
| 2004/0223200 A1 * | 11/2004 | Waldman | ................. | G03H 1/26 |

(Continued)

OTHER PUBLICATIONS

Wikipedia contributors. Faraday rotator. Wikipedia, The Free Encyclopedia. Jul. 25, 2020, 23:11 UTC. Available at: https://en.wikipedia.org/w/index.php?title=Faraday_rotator&oldid=969521072. Accessed Sep. 14, 2020.

*Primary Examiner* — Paresh Patel (74) *Attorney, Agent, or Firm* — Andrew R. Ralston; Frank D. Cimino (57) ABSTRACT

An integrated sensor includes a sensor cell, a signal source, an input optical rotator, and a signal detector. The integrated sensor includes a positioner for a signal-processing component. The positioner may be a linear positioner for the signal-processing component, such as a signal source or a signal detector, or may be a rotational positioner for the signal-processing component, such as a polarizer or a polarized signal source. The signal-processing component is located on a signal path of the integrated sensor. A method of adjusting a linear position or rotational position of a signal-processing component is also disclosed. A linear position or a rotational position of the signal-processing component may be adjusted to improve performance of the integrated sensor.

31 Claims, 8 Drawing Sheets

(56) References Cited

U.S. PATENT DOCUMENTS

| | | | |
|---|---|---|---|
| 2007/0266784 A1* | 11/2007 | Lust | G01C 19/62 |
| | | | 73/504.05 |
| 2011/0193555 A1* | 8/2011 | Sugioka | G01R 33/022 |
| | | | 324/244.1 |
| 2012/0112749 A1* | 5/2012 | Budker | G01R 33/1284 |
| | | | 324/318 |
| 2014/0368193 A1* | 12/2014 | Morales | G01R 33/26 |
| | | | 324/304 |
| 2015/0042327 A1* | 2/2015 | Bulatowicz | G01C 19/62 |
| | | | 324/301 |

* cited by examiner

COMPONENT ADJUSTMENT IN A SIGNAL PATH OF AN INTEGRATED SENSOR

FIELD

This disclosure relates to the field of integrated microfabricated vapor sensors. More particularly, this disclosure relates to signal-processing components in integrated microfabricated vapor sensors.

BACKGROUND

Integrated microfabricated alkali vapor sensors provide small form factors and low power operation, enabling atomic clocks and atomic magnetometers for mobile and unmanned applications. Reduced costs of the integrated microfabricated alkali vapor sensors have led to high volume assembly processes used for manufacturing electronic devices. These assembly processes often place components of the sensors, including signal sources and polarizers, in locations and orientations that have some positional issues and alignment issues. The issues may impact the performance of the sensors.

SUMMARY

The present disclosure introduces systems and methods for adjusting signal-processing components on a signal path of an integrated microfabricated alkali vapor sensor. In one implementation, the disclosed systems involve a linear positioner for a signal-processing component, such as a signal source or a signal detector, on the signal path. In another implementation, the disclosed systems involve a rotational positioner for a signal-processing component, such as a polarizer or a polarized signal source, on the signal path. In a further implementation, the disclosed methods involve adjusting a position, either a linear position or an angular position, of a signal-processing component on the signal path of the integrated microfabricated alkali vapor sensor. Advantageously, performance of the integrated microfabricated alkali vapor sensor may be improved by adjusting the position of the signal-processing component.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated microfabricated alkali vapor sensor, referred to herein as the integrated sensor, includes a sensor cell having an alkali vapor region, with at least one signal path extending through the sensor cell. The integrated sensor includes signal-processing components on the signal path, including at least one signal source, such as a laser, on the signal path configured to provide an input signal along the signal path into the alkali vapor region. In some cases, the signal source may be configured to provide an input signal that is linearly polarized; such a signal source may be referred to as a polarized signal source. In other cases, the signal source may be configured to provide an input signal that is unpolarized, and the integrated sensor may include a linear polarizer to linearly polarize the input signal; such a signal source may be referred to as an unpolarized signal source. The signal-processing components include a signal detector on the signal path, configured to receive an output signal along the signal paths from the alkali vapor region.

The signal-processing components include an input optical rotator on the signal path, such as a quarter wave plate (QWP), to transform the input signal to a circularly polarized state before the input signal enters the sensor cell. The signal-processing components may further include an output optical rotator, such as another QWP, on the signal path, to transform a circularly polarized output signal from the sensor cell to a linearly polarized state. The signal-processing components may include an output linear polarizer on the signal path between the output optical rotator and the signal detector. The output linear polarizer may be used as an analyzer, to block a portion of the linearly polarized output signal from the signal detector.

The signal source is preferably located so that the input signal into the sensor cell is maximized. Similarly, the signal detector is preferably located to detect a maximum amount of the output signal. During fabrication of the integrated sensor, positional errors may be introduced by placement of the signal source or the signal detector in positions different from their preferred positions. During operation of the integrated sensor, obstructions in the signal path, such as condensed alkali metal, may cause a desired position of the signal source or the signal detector to shift, possibly leading to increased positional error. Performance parameters of the integrated sensor, such as signal amplitude and signal-to-noise ratio, may be adversely affected by the positional errors. One or more linear positioners may be coupled to the signal source or the signal detector. The linear positioner may be actuated to adjust a position of the signal source or the signal detector closer to their preferred position, thus advantageously improving the affected performance parameters.

Similarly, the output linear polarizer has a preferred rotational alignment with respect to a polarization orientation of the linearly polarized input signal, to maximize the performance parameters. During fabrication of the integrated sensor, alignment errors may be introduced by placement of the output linear polarizer, the input linear polarizer, in the case of an unpolarized signal source, or the polarized signal source. One or more rotational positioners may be coupled to the output linear polarizer, the input linear polarizer, or the polarized signal source. The rotational positioner may be actuated to adjust a rotational position of the output linear polarizer with respect to the input linear polarizer, or the polarized signal source, closer to the preferred rotational alignment, thus advantageously improving the affected performance parameters.

The linear positioner or the rotational positioner may be configured so that adjusted positions are maintained after power to the integrated sensor is turned off. Alternatively, the linear positioner or the rotational positioner may be configured so that adjusted positions are not maintained after power to the integrated sensor is turned off, possibly necessitating additional adjustments when power is reapplied.

In some implementations, the position adjustments may be performed as part of a fabrication process of the integrated sensor. In other implementations, the adjustments may be performed as part of occasional calibration, qualification, or reconditioning operations. In further implementations, the adjustments may be performed during routine operation of the integrated sensor.

For the purposes of this disclosure, it will be understood that, if an element is referred to as being "coupled" to another element, it may be directly coupled to the other element, or intervening elements may be present. If an element is referred to as being "directly coupled' to another element, it is understood there are no other intentionally disposed intervening elements present. Other terms used to describe relationships between elements should be interpreted in like fashion, for example, "between" versus "directly between," and so on.

Figure 1:
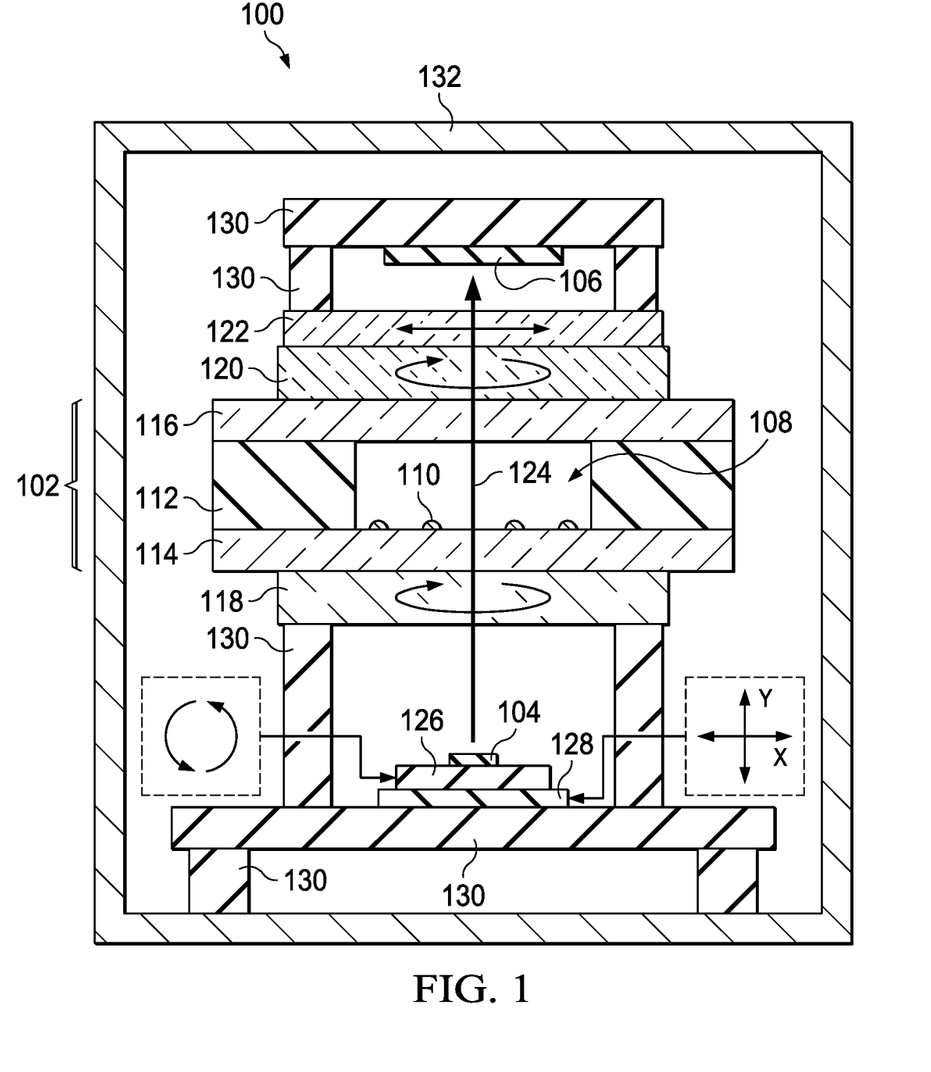
FIG. 1 is a cross section of an example integrated sensor containing a linear positioner and a rotational positioner.

FIG. 1 is a cross section of an example integrated sensor containing a linear positioner and a rotational positioner. The integrated sensor 100 includes a sensor cell 102, a signal source 104 located outside the sensor cell 102, and a signal detector 106 located outside the sensor cell 102. The signal source 104 and the signal detector 106 are on a signal path 124, which extends through the sensor cell 102. The sensor cell 102 has an alkali vapor cavity 108 containing an alkali metal 110, such as cesium or rubidium. The alkali metal 110 may be a condensed phase, as depicted in FIG. 1, or may be in a vapor phase, for example during operation of the integrated sensor 100. The sensor cell 102 may include a cell body 112 interposed between a first window 114 and a second window 116. The first window 114 is transmissive to an input signal from the signal source 104 into the alkali vapor cavity 108, and the second window 116 is transmissive to an output signal from the alkali vapor cavity 108 to the signal detector 106. In the instant example, the alkali vapor cavity 108 may extend through the cell body 112, so that the first window 114 and the second window 116 are exposed to the alkali vapor cavity 108. Other architectures of the sensor cell 102 are within the scope of the instant example.

In the instant example, the signal source 104 may be a polarized signal source, such as a vertical cavity surface emitting laser (VCSEL) having linearly polarized output. The integrated sensor 100 includes an input optical rotator 118 on the signal path 124, proximate to the signal source 104, for example between the signal source 104 and the first window 114, as depicted in FIG. 1. The input optical rotator 118 may include a QWP.

The integrated sensor 100 may include an output optical rotator 120 on the signal path 124, located proximate to the signal detector 106, for example between the signal detector 106 and the second window 116, as depicted in FIG. 1. The output optical rotator 120 may also include a QWP. The integrated sensor 100 may further include a linear polarizer 122 on the signal path 124, between the output optical rotator 120 and the signal detector 106.

The signal path 124 extends from the signal source 104 through the input optical rotator 118, through the alkali vapor cavity 108, through the output optical rotator 120, through the linear polarizer 122, to the signal detector 106. The signal path 124 may extend in a straight line, as depicted in FIG. 1.

In the instant example, the signal source 104 may be located on a rotational positioner 126 which may be located on a linear positioner 128. The rotational positioner 126 is configured to rotate the signal source 104 about an axis parallel to the signal path 124, to overcome alignment errors of a polarization orientation of the linear polarizer 122 with respect to a polarization orientation of the signal source 104, and to attain a rotational position of the signal source 104 that results in a desired value of a performance parameter of the integrated sensor 100. The performance parameter may be related to an electrical signal from the signal detector 106. The performance parameter may be, for example, an amplitude of the signal, or a signal to noise ratio. The rotational positioner 126 may be configured to rotate the signal source 104 through an angular range of, for example, 40 degrees, which is sufficient to overcome alignment errors up to +/−20 degrees. Implementations of the integrated sensor 100 in which the alignment errors are significantly less than +/−20 degrees may use a version of the rotational positioner 126 with an appropriately lower angular range. Rotational positioners with lower angular ranges typically are smaller and cost less than rotational positioners with higher angular ranges, so use of a version of the rotational positioner 126 with an appropriately lower angular range may advantageously reduce a cost of the rotational positioner 126 and hence provide a lower cost of the integrated sensor 100.

The linear positioner 128 is configured to move the signal source 104 to overcome positional errors of the signal source with respect to the alkali vapor cavity 108, and to attain a position for the signal source 104 that results in the desired value of the performance parameter. The linear positioner 128 may be configured to move the signal source 104 along a single axis perpendicular to the signal path 124, or optionally along two axes in a two-dimensional plane perpendicular to the signal path 124, as indicated schematically in FIG. 1. The linear positioner 128 may be configured to move the signal source 104 through a linear range of, for example, at least 10 percent of a width of the alkali vapor cavity 108 perpendicular to the signal path 124. Alternatively, the linear positioner 128 may be configured to move the signal source 104 through a linear range of, for example, at least 200 microns. The rotational positioner 126 may be moved with signal source 104 by the linear positioner 128. In an alternate version of the instant example, the signal source 104 may be located on the linear positioner 128, and the linear positioner 128 may be located on the rotational positioner 126.

The sensor cell 102, the signal source 104, the signal detector 106, the input optical rotator 118, the output optical rotator 120, the linear polarizer 122, the rotational positioner 126, and the linear positioner 128 are located on structural members 130 of the integrated sensor 100. The structural members 130 may include mounting plates, spacers and standoffs, of silicon, ceramic, glass, and the like. The sensor cell 102, the signal source 104, the signal detector 106, the input optical rotator 118, the output optical rotator 120, the linear polarizer 122, the rotational positioner 126, and the linear positioner 128 may be contained in a sensor package 132. A height, width, and depth of the integrated sensor 100 may each be less than 20 millimeters, to provide a desired form factor to enable mobile and unmanned applications.

Figure 2:
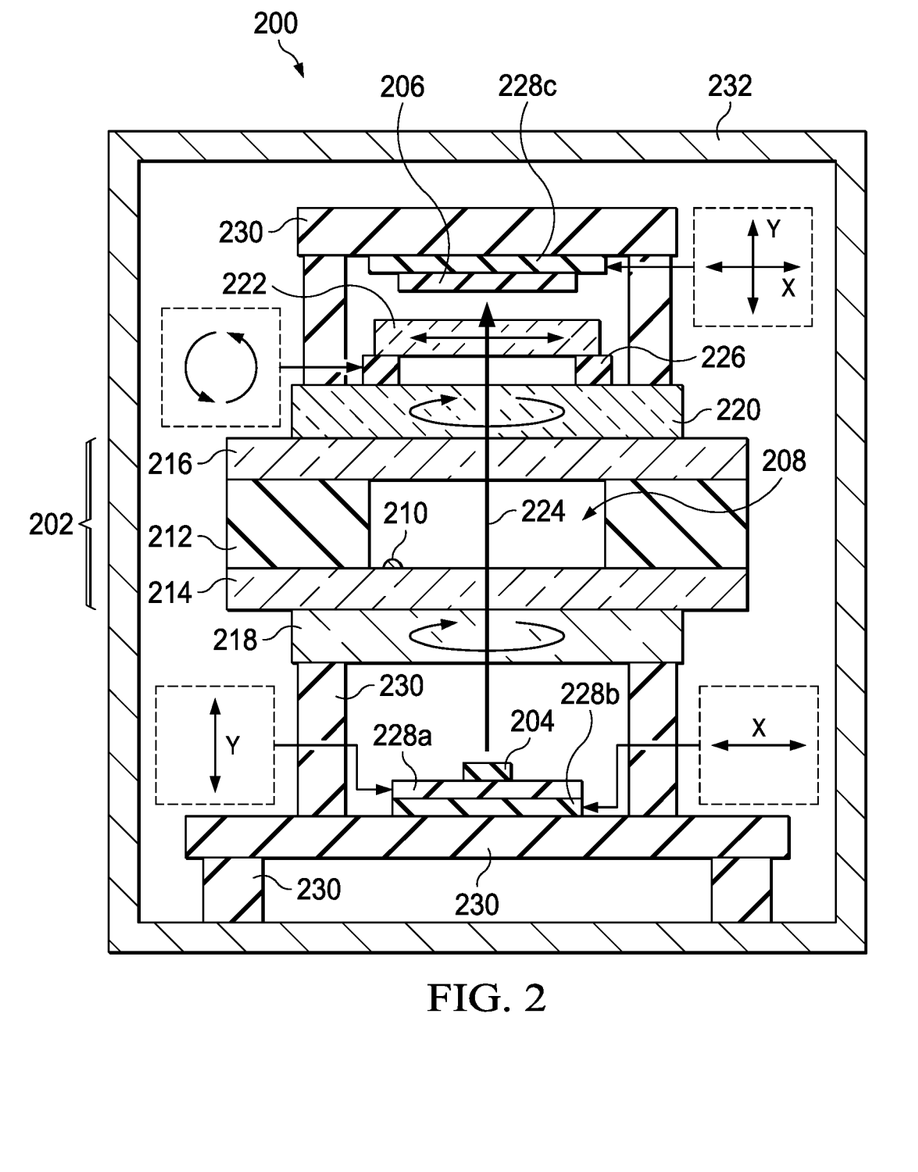
FIG. 2 is a cross section of an example integrated sensor containing stacked linear positioners and a rotational positioner.

FIG. 2 is a cross section of an example integrated sensor containing stacked linear positioners and a rotational positioner. The integrated sensor 200 includes a sensor cell 202, for example, comprising a cell body 212 laterally surrounding an alkali vapor cavity 208 containing an alkali metal 210, and a first window 214 and a second window 216 on opposite surfaces of the cell body 212. In the instant example, a signal path 224 extends through the first window 214, through the alkali vapor cavity 208, and through the second window 216. Other architectures of the sensor cell 202 are within the scope of the instant example.

The integrated sensor 200 includes a signal source 204 located outside the sensor cell 202 on the signal path 224. In the instant example, the signal source 204 may be a polarized signal source. The integrated sensor 200 includes an input optical rotator 218 located on the signal path 224 between the signal source 204 and the alkali vapor cavity 208.

The integrated sensor 200 includes a signal detector 206 located outside the sensor cell 202 on the signal path 224. The integrated sensor 200 includes an output optical rotator 220 located on the signal path 224 between the signal detector 206 and the alkali vapor cavity 208. The integrated sensor 200 further includes a linear polarizer 222 located on the signal path 224 between the output optical rotator 220 and the signal detector 206.

The signal path 224 extends from the signal source 204 through the input optical rotator 218, through the alkali vapor cavity 208, through the output optical rotator 220, through the linear polarizer 222, to the signal detector 206. The signal path 224 may extend in a straight line, as depicted in FIG. 2.

In the instant example, the signal source 204 may be located on a first linear positioner 228a which is located on a second linear positioner 228b. The first linear positioner 228a is configured to move the signal source 204 along a first axis perpendicular to the signal path 224, as indicated schematically in FIG. 2. The second linear positioner 228b is configured to move the first linear positioner 228a and the signal source 204 along a second axis that is perpendicular to the first axis and perpendicular to the signal path 224, as indicated schematically in FIG. 2. Thus a combination of the first linear positioner 228a and the second linear positioner 228b may provide a capability of moving the signal source 204 in a plane that is perpendicular to the signal path 224. The first linear positioner 228a and the second linear positioner 228b may each be configured to move through a linear range of 10 percent of a width of the alkali vapor cavity 208.

The rotational positioner 226 is configured to rotate the linear polarizer 222 around an axis parallel to the signal path 224, to overcome alignment errors of a polarization orientation of the linear polarizer 222 with respect to a polarization orientation of the signal source 204, and to attain a rotational position of the linear polarizer 222 that results in a desired value of a performance parameter of the integrated sensor 200. The rotational positioner 226 may be configured to rotate the linear polarizer 222 through an angular range of, for example, 40 degrees, or a lower angular range if appropriate.

The signal detector 206 may be located on a third linear positioner 228c configured to move the signal detector 206 to attain a position for the signal detector 206 that results in the desired value of the performance parameter. The third linear positioner 228c may be configured to move the signal detector 206 in a two dimensional plane perpendicular to the signal path 224, as indicated schematically in FIG. 2.

The sensor cell 202, the signal source 204, the signal detector 206, the input optical rotator 218, the output optical rotator 220, the linear polarizer 222, the rotational positioner 226, and the first linear positioner 228a and the second linear positioner 228b are located on structural members 230 contained in a sensor package 232. A height, width, and depth of the integrated sensor 200 may each be less than 20 millimeters, to provide a desired form factor to enable mobile and unmanned applications.

Figure 3:
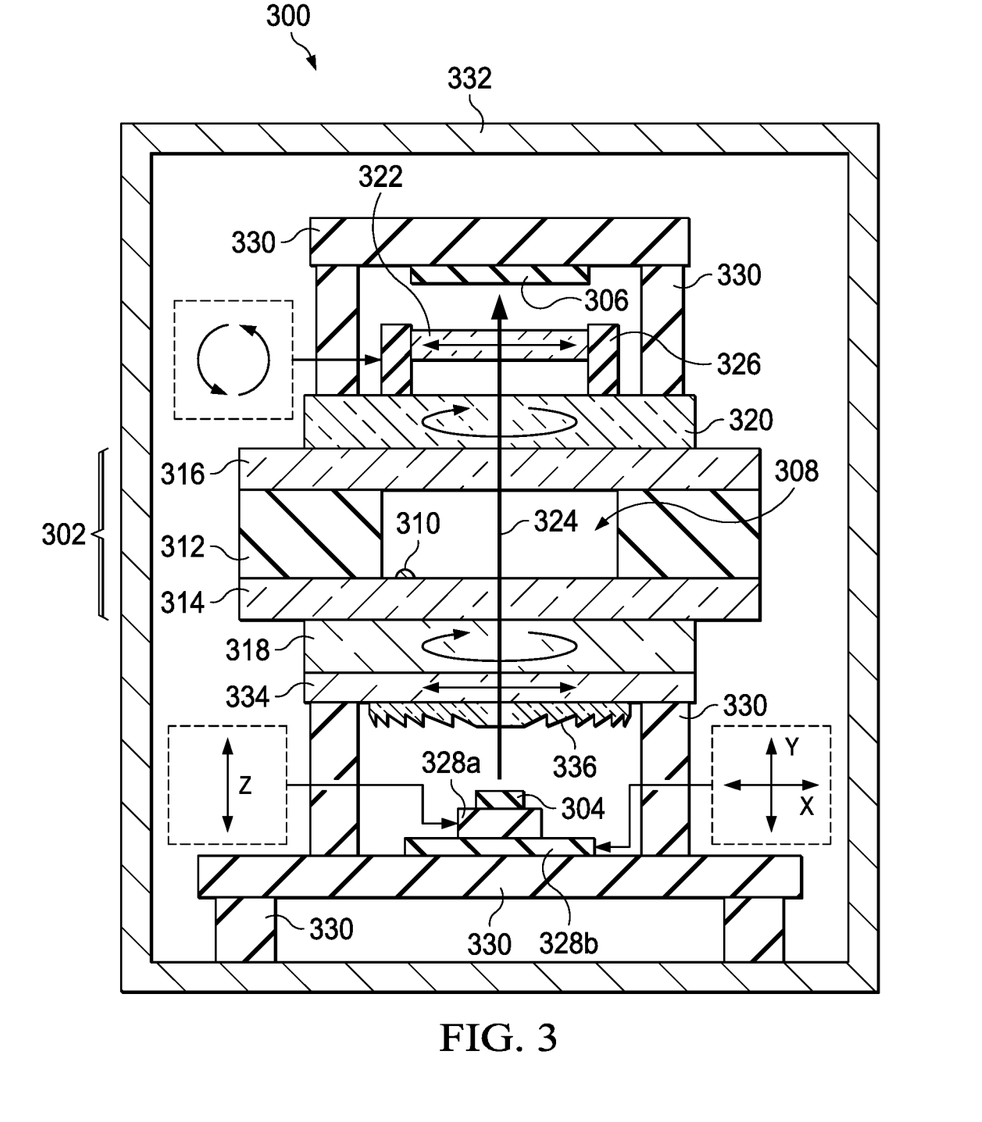
FIG. 3 is a cross section of another example integrated sensor containing stacked linear positioners and a rotational positioner.

FIG. 3 is a cross section of another example integrated sensor containing stacked linear positioners and a rotational positioner. The integrated sensor 300 includes a sensor cell 302, having, for example, a cell body 312, a first window 314, and a second window 316 surrounding an alkali vapor cavity 308 containing an alkali metal 310. In the instant example, a signal path 324 extends through the first window 314, through the alkali vapor cavity 308, and through the second window 316. Other architectures of the sensor cell 302 are within the scope of the instant example.

The integrated sensor 300 includes a signal source 304 located outside the sensor cell 302 on the signal path 324. In the instant example, the signal source 304 may be an unpolarized signal source. The integrated sensor 300 includes an input optical rotator 318 located on the signal path 324 between the signal source 304 and the alkali vapor cavity 308, and an input linear polarizer 334 located on the signal path 324 between the signal source 304 and the input optical rotator 318. The integrated sensor 300 of the instant example may further include a refracting element 336 such as a lens, as depicted in FIG. 3, located on the signal path 324 between the signal source 304 and the alkali vapor cavity 308. The refracting element 336 may advantageously direct more of an input signal from the signal source 304 into the alkali vapor cavity 308, compared to a comparable integrated sensor lacking a refracting element.

The integrated sensor 300 includes a signal detector 306 located outside the sensor cell 302 on the signal path 324. The integrated sensor 300 includes an output optical rotator 320 located on the signal path 324 between the signal detector 306 and the alkali vapor cavity 308. The integrated sensor 300 further includes an output linear polarizer 322 located on the signal path 324 between the output optical rotator 320 and the signal detector 306. The signal path 324 extends from the signal source 304 through the refracting element 336, through the input linear polarizer 334, through the input optical rotator 318, through the alkali vapor cavity 308, through the output optical rotator 320, through the output linear polarizer 322, to the signal detector 306. The signal path 324 may extend in a straight line, as depicted in FIG. 3.

In the instant example, the signal source 304 may be located on a first linear positioner 328a which is located on a second linear positioner 328b. The first linear positioner 328a is configured to move the signal source 304 along a vertical axis parallel to the signal path 324, as indicated schematically in FIG. 3. The second linear positioner 328b is configured to move the first linear positioner 328a and the signal source 304 in a plane that is perpendicular to the first axis and thus perpendicular to the signal axis 324, as indicated schematically in FIG. 3. Thus a combination of the first linear positioner 328a and the second linear positioner 328b may provide a capability of laterally moving the signal source 304 in three dimensions. The first linear positioner 328a may be used to position the signal source 304 at a desired focus point of the refracting element 336. The second linear positioner 328b may locate the signal source 304 at a position to provide a maximum input signal into the alkali vapor region 308. The rotational positioner 326 is configured to rotate the output linear polarizer 322 around an axis parallel to the signal path 324, to overcome alignment errors of a polarization orientation of the output linear polarizer 322 with respect to a polarization orientation of the input linear polarizer 334.

The sensor cell 302, the signal source 304, the signal detector 306, the input optical rotator 318, the output optical rotator 320, the output linear polarizer 322, the rotational positioner 326, and the first linear positioner 328a, and the second linear positioner 328b are located on structural members 330 contained in a sensor package 332. A height, width, and depth of the integrated sensor 300 may each be less than 20 millimeters, to provide a desired form factor.

Figure 4:
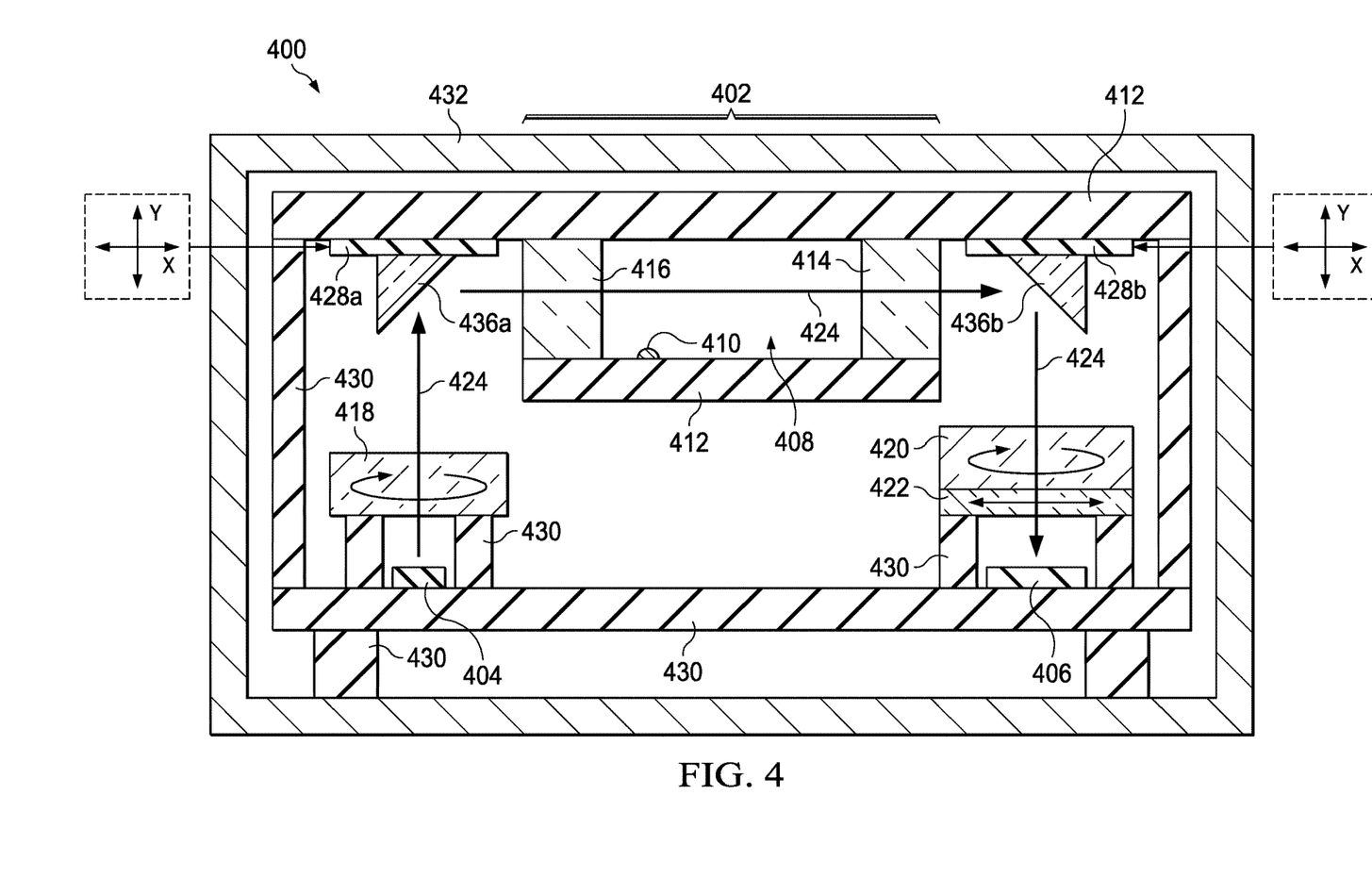
FIG. 4 is a cross section of another example integrated sensor containing stacked linear positioners and a rotational positioner.

FIG. 4 is a cross section of another example integrated sensor containing stacked linear positioners and a rotational positioner. The integrated sensor 400 includes a sensor cell 402, having, for example, a cell body 412 with a first window 414 and a second window 416. The sensor cell 402 has an alkali vapor cavity 408 containing an alkali metal 410. In the instant example, a signal path 424 extends through the first window 414, through the alkali vapor cavity 408, and through the second window 416. Other architectures of the sensor cell 402 are within the scope of the instant example.

The integrated sensor 400 of the instant example includes a signal source 404 located outside the sensor cell 402 on the signal path 424. In the instant example, the signal source 404 may be a polarized signal source. The integrated sensor 400 includes an input optical rotator 418 located on the signal path 424 between the signal source 404 and the alkali vapor cavity 408, and a first reflecting element 436a located on the signal path 424 between the input optical rotator 418 and the alkali vapor region 408. The first reflecting element 436a may include a first reflector, as depicted in FIG. 4.

The integrated sensor 400 includes a signal detector 406 located outside the sensor cell 402 on the signal path 424. The integrated sensor 400 includes an output optical rotator 420 located on the signal path 424 between the signal detector 406 and the alkali vapor cavity 408, and a linear polarizer 422 located on the signal path 424 between the output optical rotator 420 and the signal detector 406. The integrated sensor 400 of the instant example further includes a second reflecting element 436b, which may include a second reflector as depicted in FIG. 4, located on the signal path 424 between the alkali vapor cavity 408 and the output optical rotator 420. The first reflecting element 436a and the second reflecting element 436b may advantageously enable a desired configuration of the signal source 404, the input optical rotator 418, and the alkali vapor cavity 408.

The signal path 424 extends from the signal source 404 through the input optical rotator 418 to the first reflecting element 436a, from the first reflecting element 436a through the alkali vapor cavity 408 to the second reflecting element 436b, and from the second reflecting element 436b through the output optical rotator 420, through the linear polarizer 422, to the signal detector 406. The signal path 424 may extend in a sequence of straight line segments, as depicted in FIG. 4.

In the instant example, the first reflecting element 436a may be located on a first linear positioner 428a. The first linear positioner 428a may be configured to move the first reflecting element 436a in two dimensions perpendicular to a segment of the signal path 424 that extends from the signal source 404 to the first reflecting element 436a, as indicated schematically in FIG. 4, to direct a desired fraction of an input signal from the signal source 404 into the alkali vapor region 408. The second signal processing element 436b may be located on a second linear positioner 428b, configured to move the second reflecting element 436b in two dimensions perpendicular to a segment of the signal path that extends from the second reflecting element 436b to the signal detector 406, as indicated schematically in FIG. 4, to direct a desired fraction of an output signal from the alkali vapor region 408 to the signal detector 406.

The sensor cell 402, the signal source 404, the signal detector 406, the input optical rotator 418, the output optical rotator 420, the linear polarizer 422, the first reflecting element 436a, the second reflecting element 436b, the first linear positioner 428a, and the second linear positioner 428b are located on structural members 430, optionally contained in a sensor package 432. A height, width, and depth of the integrated sensor 400 may each be less than 20 millimeters, to provide a desired form factor.

Figure 5:
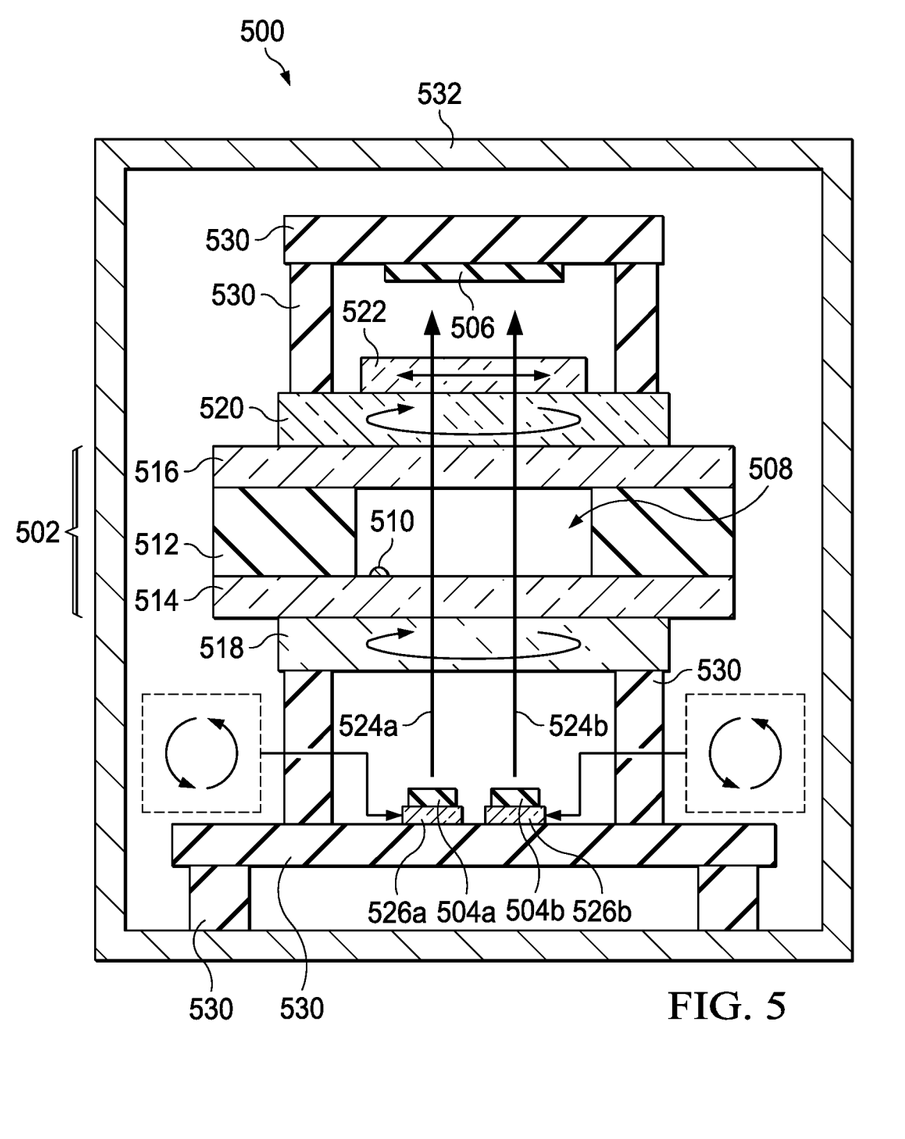
FIG. 5 is a cross section of an example integrated sensor containing stacked linear positioners and a rotational positioner.

FIG. 5 is a cross section of an example integrated sensor containing stacked linear positioners and a rotational positioner. The integrated sensor 500 includes a sensor cell 502, for example, comprising a cell body 512 laterally surrounding an alkali vapor cavity 508 containing an alkali metal 510, and a first window 514 and a second window 516 on opposite surfaces of the cell body 512. In the instant example, a first signal path 524a and a second signal path 524b extend through the first window 514, through the alkali vapor cavity 508, and through the second window 516. Other architectures of the sensor cell 502 are within the scope of the instant example.

The integrated sensor 500 of the instant example includes a first signal source 504a located outside the sensor cell 502 on the first signal path 524a, and a second signal source 504b located outside the sensor cell 502 on the second signal path 524b. In the instant example, the first signal source 504a and the second signal source 504b may both be polarized signal sources. The integrated sensor 500 includes an input optical rotator 518; the input optical rotator 518 is located on the first signal path 524a and on the second signal path 524b, between the first signal source 504a and the alkali vapor cavity 508, and between the second signal source 504b and the alkali vapor cavity 508.

The integrated sensor 500 includes a signal detector 506 located outside the sensor cell 502 on the first signal path 524a and on the second signal path 524b. The integrated sensor 500 includes an output optical rotator 520 located on the first signal path 524a and on the second signal path 524b, between the signal detector 506 and the alkali vapor cavity 508. The integrated sensor 500 further includes a linear polarizer 522 located on the first signal path 524a and on the second signal path 524b, between the output optical rotator 520 and the signal detector 506.

The first signal path 524a extends from the first signal source 504a through the input optical rotator 518, through the alkali vapor cavity 508, through the output optical rotator 520, through the linear polarizer 522, to the signal detector 506. The second signal path 524b extends from the second signal source 504*b* through the input optical rotator 518, through the alkali vapor cavity 508, through the output optical rotator 520, through the linear polarizer 522, to the signal detector 506. The first signal path 524*a* and the second signal path 524*b* may extend in straight lines, as depicted in FIG. 5.

In the instant example, the first signal source 504*a* may be located on a first rotational positioner 526*a*, and the second signal source 504*b* may be located on a second rotational positioner 526*b*. The first rotational positioner 526*a* is configured to rotate the first signal source 504*a* to overcome alignment errors of a polarization orientation of the linear polarizer 522 with respect to a polarization orientation of the first signal source 504*a*. Similarly, the second rotational positioner 526*b* is configured to rotate the second signal source 504*b*, independently of the first signal source 504*a*, to overcome alignment errors of a polarization orientation of the linear polarizer 522 with respect to a polarization orientation of the second signal source 504*b*. The first rotational positioner 526*a* and the second rotational positioner 526*b* may each be configured to move through an angle of 40 degrees.

The sensor cell 502, the first signal source 504*a*, second signal source 504*b*, the signal detector 506, the input optical rotator 518, the output optical rotator 520, the linear polarizer 522, the first rotational positioner 526*a*, and the second rotational positioner 526*b* are located on structural members 530 contained in a sensor package 532. A height, width, and depth of the integrated sensor 500 may each be less than 20 millimeters, to provide a desired form factor to enable mobile and unmanned applications.

Figure 6:
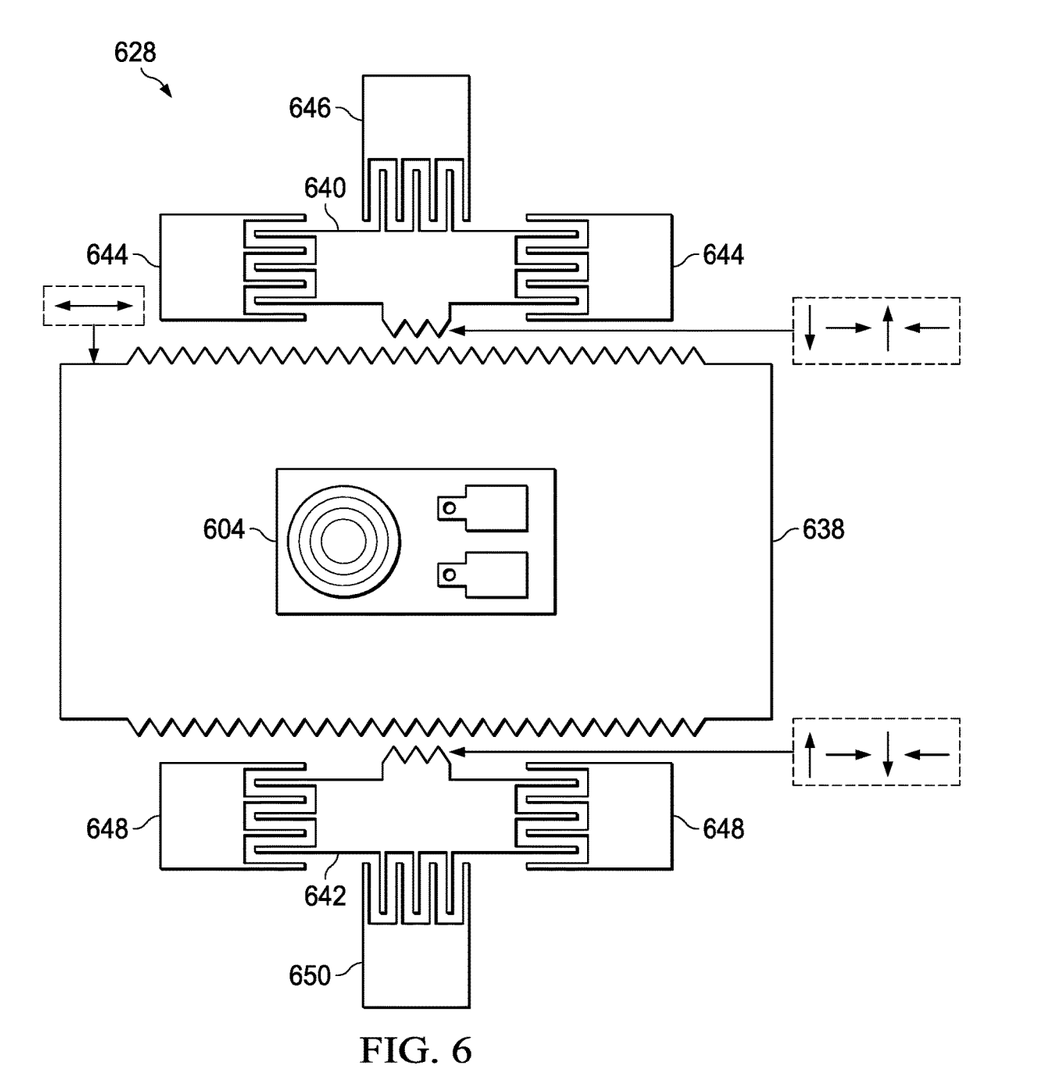
FIG. 6 depicts an example linear positioner for use in an integrated sensor.

FIG. 6 depicts an example linear positioner for use in an integrated sensor. The linear positioner 628 includes a movable plate 638 configured to move along one axis, as indicated in FIG. 6. A signal-processing component 604 of the integrated sensor is located on the movable plate 638. The signal-processing component 604 may include, for example, a VCSEL as depicted in FIG. 6, or a signal detector. The linear positioner 628 includes a first actuator 640 and a second actuator 642 located on opposite sides of the movable plate 638. The first actuator 640 and the second actuator 642 are configured to engage the movable plate 638 and translate the movable plate 638 incrementally along the axis of motion. The linear positioner 628 further includes first perpendicular drivers 644 configured to move the first actuator 640 an incremental distance perpendicular to the axis of motion of the movable plate 638, and a first parallel driver 646 configured to move the first actuator 640 an incremental distance parallel to the axis of motion of the movable plate 638. The first perpendicular drivers 644 and the first parallel driver 646 may be configured to move the first actuator 640 by electrostatic force, for example, using interleaved plates as depicted in FIG. 6, or by another mechanism such as piezoelectric action or thermal expansion. Similarly, the linear positioner 628 further includes second perpendicular drivers 648 configured to move the second actuator 642 an incremental distance perpendicular to the axis of motion of the movable plate 638, and a second parallel driver 650 configured to move the second actuator 642 an incremental distance parallel to the axis of motion of the movable plate 638. The first perpendicular drivers 644, the first parallel driver 646, second perpendicular drivers 648, and the second parallel driver 650 may be fixedly located on a structural member, such as a mounting plate, of the integrated sensor. The first actuator 640, the second actuator 642, and the movable plate 638 may be tethered to the structural member or to the first perpendicular drivers 644, the first parallel driver 646, second perpendicular drivers 648, or the second parallel driver 650 so as to constrain movement of the movable plate 638 to linear movement along the axis of motion.

During operation of the integrated sensor, the first perpendicular drivers 644 and the first parallel driver 646, and may move the first actuator 640 sequentially to engage the movable plate 638, move the movable plate 638 an incremental distance along the axis of motion, disengage the movable plate 638, and subsequently return to a starting position, as indicated schematically in FIG. 6. The second perpendicular drivers 648 and the second parallel driver 650 may move the second actuator 642 in a similar sequence in coordination with the first actuator 640, to move the movable plate 638. Repetition of the sequence of motions of the first actuator 640 and the second actuator 642 may be performed to move the movable plate 638 a desired distance in incremental steps.

In one version of the instant example, the first actuator 640 and the second actuator 642 may be configured to hold the movable plate 638 during periods of non-operation, which may maintain the movable plate 638 in an adjusted position during a subsequent period of non-operation. Maintaining the adjustment position may advantageously reduce time during the subsequent operation period to attain a desired performance of the integrated sensor.

Figure 7:
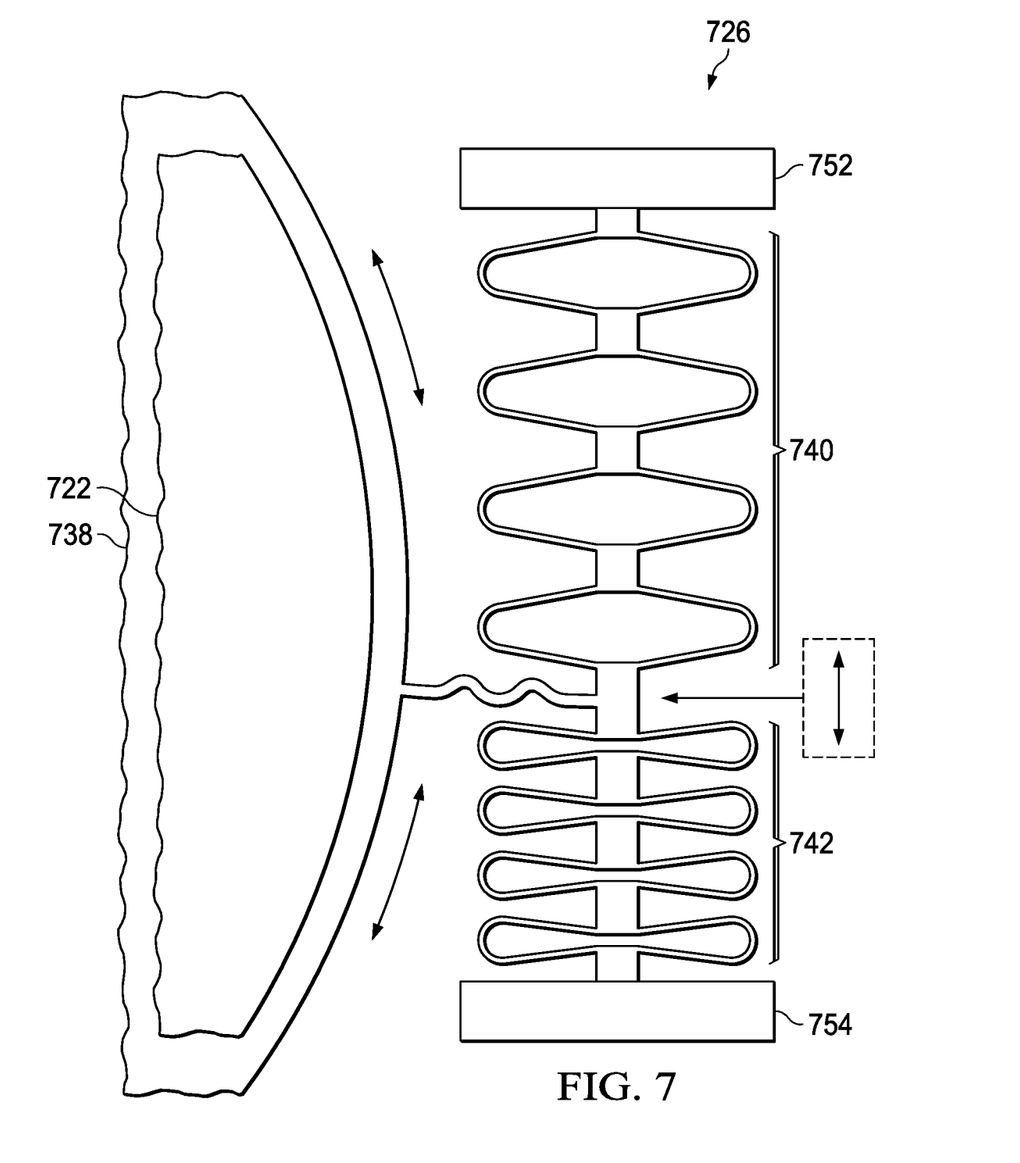
FIG. 7 depicts an example rotational positioner for use in an integrated sensor.

FIG. 7 depicts an example rotational positioner for use in an integrated sensor. The rotational positioner 726 includes a rotatable member 738 configured to rotate in a plane, for example, a plane that is perpendicular to a signal path extending through the rotatable member 738. A signal-processing component 722 of the integrated sensor is located on the rotatable member 738. The signal-processing component 722 may include, for example, a linear polarizer or a polarized signal source. The rotational positioner 726 includes a first actuator 740 and a second actuator 742 coupled in a push-pull arrangement to the rotatable member 738. The first actuator 740 may be coupled to a first base 752 which is fixedly located on a structural member of the integrated sensor. Similarly, the second actuator 742 may be coupled to a second base 754 which is also fixedly located on the structural member. The first actuator 740 and the second actuator 742 may be configured to rotate the rotatable member 738 by piezoelectric action, by thermal expansion, or another mechanism.

During operation of the integrated sensor, the rotatable member 738 may be rotated in a first direction by extension of the first actuator 740 from the first base 752, and may be rotated in a second, opposite, direction by extension of the second actuator 742 from the second base 754. The rotational positioner 726 may include a mechanism, not shown, to maintain the rotatable member 738 in a desired position during periods of non-operation.

Figure 8:
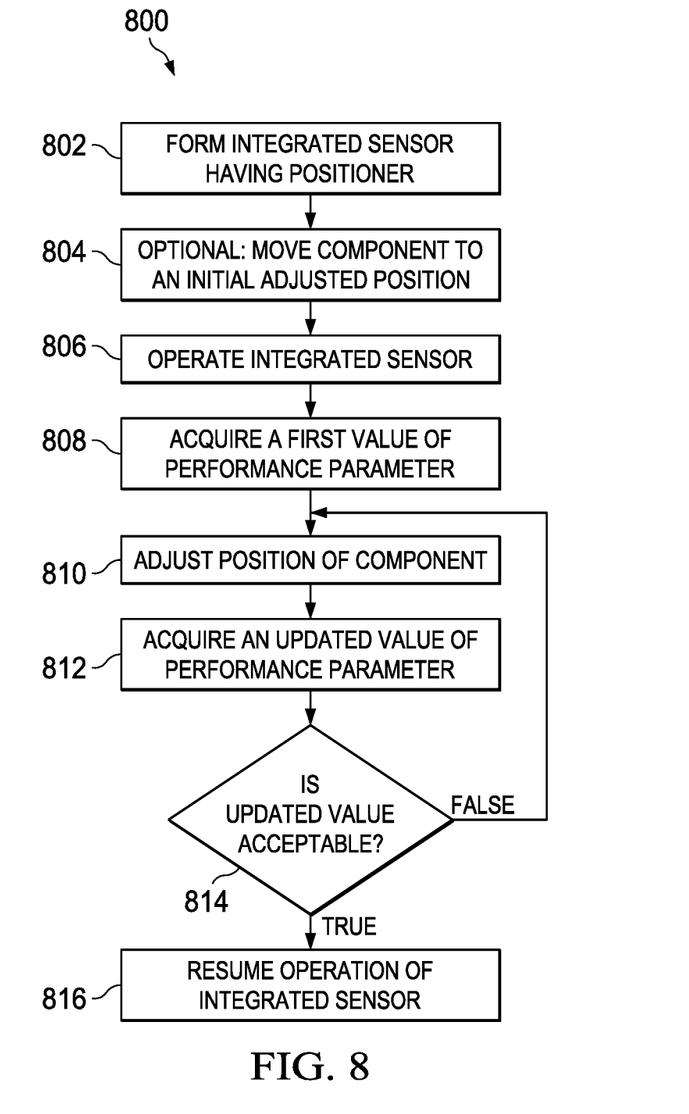
FIG. 8 is a flowchart of an example method of operating an integrated sensor.

FIG. 8 is a flowchart of an example method of operating an integrated sensor. The method 800 may begin with step 802 which is to form the integrated sensor having a positioner for a signal-processing component on a signal path. The positioner may include, for example, a linear positioner or a rotational positioner. The signal-processing component may include, for example, a signal source, a linear polarizer, an optical rotator, or a signal detector. In the instant step, the integrated sensor is formed wherein the positioner is configured to adjust a position of the signal-processing component.

Optional step 804 is to move the signal-processing component to an initial adjusted position using the positioner. In a version of the instant example in which the positioner is a linear positioner, the initial adjusted position may be a linear position. In a version of the instant example in which the positioner is a rotational positioner, the initial adjusted position may be a rotational position. The initial adjusted position may be provided by an estimate based on previous experience with similar integrated sensors. The initial adjusted position may be provided by a stored value of a previous adjustment of the instant integrated sensor.

Step 806 is to operate the integrated sensor. The integrated sensor may be functioning, for example, as a magnetometer or an atomic clock. The signal-processing component may be in a default position, for example, a position provided by the forming of the integrated sensor in step 802. Alternatively, the signal-processing component may be in a position provided by a previous adjustment using the positioner.

Step 808 is to acquire a first value of a performance parameter of the integrated sensor while the integrated sensor is being operated in step 806. The performance parameter may be characteristic of an electrical signal amplitude from the signal detector of the integrated sensor or characteristic of a signal-to-noise ratio from the signal detector.

Step 810 is to adjust the position of the signal-processing component using the positioner. In one version of the instant step, the position may be adjusted by an extent that is related to the first value of the performance parameter, for example, an estimated adjustment to provide a target value of the performance parameter. In another version of the instant step, the position may be adjusted by a predetermined extent, for example, as part of an iteration over a range of position values. In a further version, the position may be adjusted by an extent that is related to previous adjustments, for example as provided by an algorithm that searches for an optimum position.

Step 812 is to acquire an updated value of the performance parameter. The updated value may reflect the performance of the integrated sensor as a result of the adjustment provided in step 810.

Step 814 is to determine if the updated value of the performance parameter is acceptable, that is, if the updated value of the performance parameter meets the target value. For example, the updated value of the performance parameter may meet the target value, if the updated value of the performance parameter represents a maximum expected value at the time the updated value was acquired, or if the updated value exceeds an threshold for the performance parameter, irrespective of previous values of the performance parameter.

If the result of step 814 is FALSE, that is, the updated value of the performance parameter is not acceptable, execution of the method 800 may resume with step 810, which is to adjust the signal-processing component, using the positioner, to a new position. The new position may reflect the updated value of the performance parameter acquired in step 812.

If the result of step 814 is TRUE, that is, the updated value of the performance parameter is acceptable, execution of the method 800 may resume with step 816, which is to continue operation of the integrated sensor with the signal-processing component in the adjusted position.

Steps 806 through 814 of the method 800 may be executed after forming the integrated sensor in step 802, as part of a process of forming an electronic device containing the integrated sensor. Steps 806 through 814 may be executed as part of a calibration, qualification, or reconditioning operation for the integrated sensor while the integrated sensor is offline. Steps 806 through 816 may be executed as part of a routine or periodic optimization operation for the integrated sensor while the integrated sensor is online, that is performing its intended function.

It should be appreciated that the disclosed example may be implemented in numerous ways, including as a process, an apparatus, a system, a device, program instructions in a computer readable medium, or a method.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated sensor, comprising:
   a sensor package including a sensor cell having a signal path extending therethrough;
   signal-processing components on the signal path, the signal-processing components including:
   an optical signal source within the sensor package and outside the sensor cell;
   an input optical rotator between the optical signal source and the sensor cell;
   an optical signal detector within the sensor package and outside the sensor cell; and
   a rotational positioner configured to rotate one of the signal-processing components around a linear axis parallel to the signal path.

2. The integrated sensor of claim 1, wherein the sensor cell has an alkali vapor cavity containing an alkali metal.

3. The integrated sensor of claim 1, wherein:
   the optical signal source is a polarized optical signal source; and
   the rotational positioner is configured to rotate the polarized optical signal source around the linear axis parallel to the signal path.

4. The integrated sensor of claim 1, wherein:
   the optical signal source is an unpolarized optical signal source;
   the signal-processing components include an input linear polarizer between the unpolarized optical signal source and the input optical rotator; and
   the rotational positioner is configured to rotate the input linear polarizer.

5. The integrated sensor of claim 1, further comprising a linear positioner configured to move the optical signal source along a linear axis perpendicular to the signal path.

6. The integrated sensor of claim 1, further comprising a linear positioner configured to move the optical signal source along the linear axis parallel to the signal path.

7. The integrated sensor of claim 1, wherein:
   the signal-processing components include:
   an output optical rotator between the signal detector and the sensor cell; and
   a linear polarizer between the output optical rotator and the signal detector; and
   the rotational positioner is configured to rotate the linear polarizer.

8. The integrated sensor of claim 1, further comprising a linear positioner configured to move the signal detector along a linear axis perpendicular to the signal path.

9. The integrated sensor of claim 1,
further comprising a linear positioner configured to move the one of the signal-processing components along a linear axis through a range of at least 10 percent of a width of an alkali vapor cavity of the sensor cell, wherein the width is perpendicular to a signal path through the alkali vapor cavity.

10. The integrated sensor of claim 1,
further comprising a linear positioner configured to move the one of the signal-processing components along a linear axis through a range of at least 200 microns.

11. The integrated sensor of claim 1, wherein:
the rotational positioner is configured to move the one of the signal-processing components through an angular range of at least 40 degrees.

12. The integrated sensor of claim 1,
further comprising a linear positioner configured to maintain the one of the signal-processing components in an adjusted position.

13. The integrated sensor of claim 1, wherein:
the rotational positioner is configured to maintain the one of the signal-processing components in an adjusted angular position.

14. An integrated sensor, comprising:
a sensor cell having an optical cavity, an optical source configured to direct an optical signal through the optical cavity via a signal path, an optical detector configured to receive the optical signal, a first window between the optical cavity and the optical source and a second window between the optical cavity and the optical detector; and
a positioner on a same side of the optical cavity as the first window, the positioner configured to translate or rotate the optical source relative to the sensor cell or the optical detector to increase a signal-to-noise ratio of an electrical signal produced by the optical detector in response to the optical signal.

15. The integrated sensor of claim 14, wherein the optical source is located between the optical cavity and the positioner.

16. The integrated sensor of claim 14, wherein the sensor cell includes a cavity containing an alkali metal.

17. The integrated sensor of claim 14, wherein:
the optical source is a polarized signal source; and
the positioner is configured to rotate the polarized signal source relative to the sensor cell.

18. The integrated sensor of claim 14, wherein the optical source is an unpolarized signal source, and further comprising:
an input linear polarizer between the unpolarized signal source and the sensor cell, the positioner configured to rotate the optical source relative to the input linear polarizer.

19. The integrated sensor of claim 14, wherein the positioner is configured to translate the optical source along a linear axis perpendicular to the signal path.

20. The integrated sensor of claim 14, wherein the positioner includes a linear positioner configured to translate the optical source along a linear axis parallel to the signal path.

21. The integrated sensor of claim 14, further comprising:
an output optical rotator between the optical detector and the sensor cell;
a linear polarizer between the optical detector and the sensor cell; and
a second positioner configured to rotate the linear polarizer relative to the sensor cell.

22. The integrated sensor of claim 14, further comprising a second positioner configured to translate the optical detector along a linear axis perpendicular to the signal path.

23. The integrated sensor of claim 14, wherein the positioner is configured to move the optical source along a linear axis perpendicular to the signal path through a range of at least 10 percent of a width of the optical cavity of the sensor cell, wherein the width is determined perpendicular to the signal path through the vapor cavity.

24. The integrated sensor of claim 14, wherein the positioner is configured to translate the optical source along a linear axis through a range of at least 200 microns.

25. The integrated sensor of claim 14, wherein the positioner is configured to rotate the optical source through an angular range of at least 40 degrees relative to the sensor cell or the optical detector.

26. The integrated sensor of claim 1, wherein the rotational positioner is configured to adjust the position of the one of the signal-processing components using a movable plate actuated by an electrostatic force.

27. The integrated sensor of claim 1, wherein the rotational positioner is configured to adjust the position of the one of the signal-processing components using a movable plate actuated by piezoelectric action.

28. The integrated sensor of claim 14, wherein the positioner is configured to translate or rotate the optical source using a movable plate actuated by an electrostatic force.

29. The integrated sensor of claim 14, wherein the positioner is configured to translate or rotate the optical source using a movable plate actuated by a piezoelectric action.

30. The integrated sensor of claim 14, wherein the positioner is configured to translate or rotate the optical source using a movable plate actuated by thermal expansion.

31. A sensor for sensing light from an optical source in an atomic clock or an optical magnetometer, comprising:
the optical source located over a substrate;
an optical receiver;
a sensor cell having a vapor cavity located between the optical source and the optical receiver, a signal path extending without change of direction from the optical source to the optical receiver through the sensor cell to the optical receiver;
an optical rotator between the optical source and the sensor cell; and
a rotational positioner between the substrate and the optical source, the rotational positioner configured to rotate the optical source with respect to the optical rotator.

* * * * *